(12) United States Patent
Yang et al.

(10) Patent No.: US 9,690,406 B2
(45) Date of Patent: Jun. 27, 2017

(54) PIXEL CIRCUIT, METHOD FOR DRIVING PIXEL CIRCUIT, ORGANIC LIGHT-EMITTING DIODE DISPLAY PANEL, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Shengji Yang, Beijing (CN); Xue Dong, Beijing (CN); Haisheng Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 74 days.

(21) Appl. No.: 14/443,901

(22) PCT Filed: Aug. 29, 2014

(86) PCT No.: PCT/CN2014/085587
§ 371 (c)(1),
(2) Date: May 19, 2015

(87) PCT Pub. No.: WO2015/188468
PCT Pub. Date: Dec. 17, 2015

(65) Prior Publication Data
US 2016/0291743 A1    Oct. 6, 2016

(30) Foreign Application Priority Data
Jun. 9, 2014 (CN) .......................... 2014 1 0253578

(51) Int. Cl.
G06F 3/041   (2006.01)
G06F 3/042   (2006.01)
(Continued)

(52) U.S. Cl.
CPC .......... *G06F 3/0412* (2013.01); *G06F 3/0416* (2013.01); *G06F 3/0421* (2013.01);
(Continued)

(58) Field of Classification Search
CPC ...... G06F 3/041; G06F 3/0412; G06F 3/0416; G06F 3/042; G06F 3/0421;
(Continued)

(56) References Cited

U.S. PATENT DOCUMENTS

2005/0099372 A1    5/2005  Nakamura et al.
2013/0063398 A1    3/2013  Ko et al.
(Continued)

FOREIGN PATENT DOCUMENTS

CN    103034365 A    4/2013
CN    103135846 A    6/2013
(Continued)

OTHER PUBLICATIONS

Written Opinion of the International Searching Authority for international application No. PCT/CN2014/085587. Dated Feb. 27, 2015.

*Primary Examiner* — Nathan Danielsen
(74) *Attorney, Agent, or Firm* — Harness, Dickey & Pierce, P.L.C.

(57) ABSTRACT

The pixel circuit according to an embodiment of the present disclosure may include: a display driving module, arranged to compensate for the voltage threshold of the driving transistor by a data signal inputted by the data line and a first signal inputted by the first signal source in a time period, which is under a control of a first scanning signal inputted (Continued)

by the first scanning line, a second scanning signal inputted by the second scanning line, and a control signal inputted by the control line, so that a light-emitting driving signal of the OLED is independent of the voltage threshold of the driving transistor, within a fourth stage of the time period; and an in-cell touch detection module, arranged to detect a touch signal of a touch screen based on a variation of light caused by a touch operation in the time period, which is under the control of the first scanning signal and the control signal.

20 Claims, 8 Drawing Sheets (51) Int. Cl.
*G09G 3/32* (2016.01)
*H01L 27/32* (2006.01)
*H01L 31/112* (2006.01)
*G09G 3/3258* (2016.01)
*G09G 3/3233* (2016.01)
*H01L 27/12* (2006.01)

(52) U.S. Cl.
CPC ......... *G09G 3/3233* (2013.01); *G09G 3/3258* (2013.01); *H01L 27/323* (2013.01); *H01L 27/3262* (2013.01); *H01L 27/3265* (2013.01); *H01L 27/3276* (2013.01); *H01L 31/112* (2013.01); *G09G 2300/043* (2013.01); *G09G 2300/0426* (2013.01); *G09G 2300/0814* (2013.01); *G09G 2300/0819* (2013.01); *G09G 2300/0842* (2013.01); *G09G 2300/0861* (2013.01); *G09G 2300/0866* (2013.01); *G09G 2310/08* (2013.01); *G09G 2320/0233* (2013.01); *G09G 2320/043* (2013.01); *G09G 2320/045* (2013.01); *H01L 27/124* (2013.01); *H01L 27/1255* (2013.01)

(58) Field of Classification Search
CPC .............................. G09G 3/30–3/3258; G09G 2300/0421–2300/043; G09G 2300/0842–2300/0852; G09G 2320/0233; H01L 27/124; H01L 27/323; H01L 27/326–27/3265; H01L 27/3276; H01L 31/112–31/1129
See application file for complete search history.

(56) References Cited

U.S. PATENT DOCUMENTS

2014/0125632 A1* 5/2014 Chen .................... G06F 3/0412
345/175
2014/0306867 A1* 10/2014 Qing ................... G09G 3/3233
345/76

FOREIGN PATENT DOCUMENTS

| CN | 103150061 A | 6/2013 |
| CN | 103218085 A | 7/2013 |
| CN | 103218972 A | 7/2013 |
| CN | 103246396 A | 8/2013 |
| CN | 103310728 A | 9/2013 |
| CN | 103383837 A | 11/2013 |
| CN | 103413521 A | 11/2013 |
| CN | 103456267 A | 12/2013 |
| CN | 203870951 U | 10/2014 |

* cited by examiner

PIXEL CIRCUIT, METHOD FOR DRIVING PIXEL CIRCUIT, ORGANIC LIGHT-EMITTING DIODE DISPLAY PANEL, AND DISPLAY DEVICE

CROSS REFERENCE OF RELATED APPLICATIONS

This application is the U.S. national phase of PCT Application No. PCT/CN2014/085587 filed on Aug. 29, 2014, which claims priority to Chinese Patent Application No. 201410253578.8 filed on Jun. 9, 2014, the disclosures of which are incorporated in their entirety by reference herein.

TECHNICAL FIELD

The present disclosure relates to the technical field of displaying, and more particular to a pixel circuit, a method for driving the pixel circuit, an organic light-emitting diode (OLED) display panel and a display device.

BACKGROUND

The active matrix organic light-emitting diode (AMO-LED) is becoming one of research focuses in the technical field of panel displays. Comparing with a liquid crystal display (LCD), an organic light-emitting diode (OLED) has advantages of low energy consumption, low production cost, self luminescence, wide viewing angle and fast response. Until now, the OLED has begun to take place of the traditional LCD screen in a display field of cell phone, personal digital assistant (PDA), digital camera, and etc. The design of the pixel driving circuit is an essential technical field for the AMOLED, and is of great research significance.

In contrast to control brightness by steady voltage in the TFT-LCD, it is necessary for the light emitting to be controlled by steady current in the OLED since the OLED is driven by the current. Due to manufacture process and aging of devices, a voltage threshold ($V_{th}$) for driving a thin-film transistor in each pixel may be drifted, which leads to a variation of the current running through the OLED of each pixel with a variation of the voltage threshold. As a result, the display brightness is not in uniform and degrades the display of a whole image.

Until now, a technique of in-cell touch has been successfully implemented in the LCD display. The in-cell touch not only has good touch sensitivity and functions as a capacitor-type touch may have, but also has a particular advantage, i.e. being not limited by a size of a screen, and thus plays an important role in a big-size touching screen. In addition, in the in-cell touch, the touching not only may be implemented by a finger, but also may be implemented by a laser pointer remotely.

Thus, in the display field, it is a tendency to integrate the in-cell touch with the AMOLED in the future.

SUMMARY

According to the pixel circuit, the method for driving the pixel circuit, the organic light-emitting display panel and the display device of the present disclosure, it is not only that the adverse impact on the light-emitting driving signal caused by the voltage threshold of the driving transistor may be eliminated, so that the uniformity of the brightness of the OLED display panel is improved and the display effect of the display device is enhanced, but also that the touch detection may be implemented while the display driving is implemented, so that the display driving and the touch detection can be efficiently integrated.

The solution of the present disclosure is as follows:

In an embodiment of the present disclosure, it is provide a pixel circuit including a first storage capacitor, a driving transistor and an organic light-emitting diode (OLED). A gate electrode of the driving transistor may be connected to a second end of the first storage capacitor, and a drain electrode of the driving transistor may be connected to an anode of the OLED.

the pixel circuit may further include:

a display driving module, arranged to be connected to a first scanning line, a second scanning line, a control line, a data line, a first signal source, and a second signal source respectively, and compensate for the voltage threshold of the driving transistor by using a data signal inputted by the data line and a first signal inputted by the first signal source in a time period, which is under a control of a first scanning signal inputted by the first scanning line, a second scanning signal inputted by the second scanning line, and a control signal inputted by the control line, so that a light-emitting driving signal of the OLED is independent of the voltage threshold of the driving transistor, within a fourth stage of the time period; and an in-cell touch detection module, arranged to be connected to the first scanning line, the control line and a signal reading line respectively, and detect a touch signal of a touch screen based on a variation of light caused by a touch operation in the time period, which is under the control of the first scanning signal inputted by the first scanning line and the control signal inputted by the control line.

Optionally, the display driving module may include:

a charging unit, arranged to be connected to the data line, the first scanning line, the first storage capacitor, the driving transistor and the first signal source respectively, and control the first storage capacitor so that a potential of a first end of the first storage capacitor is kept to be a potential of the data signal, and control the first storage capacitor so that a potential of the second end of the first storage capacitor is kept to be a potential of the first signal, within a first stage of the time period;

a discharging unit, arranged to be connected to the driving transistor, the second scanning line and the second signal source respectively, and discharge the first storage capacitor so that the potential of the second end of the first storage capacitor is decreased from the potential of the first signal to a potential being equal to the voltage threshold of the driving transistor, within a second stage of the time period; and a jumping unit, arranged to be connected to the first end of the first storage capacitor, the control line and the first signal source respectively, and control the first storage capacitor so that the potential of the first end of the first storage capacitor becomes the potential of the first signal from the potential of the data signal, and the potential of the second end of the first storage capacitor equals to a sum of the potential of the first signal and the potential of the voltage threshold of the driving transistor minus the potential of the data signal, within a third stage of the time period.

Optionally, the charging unit may include:

a first thin film transistor (TFT) and a second TFT, wherein:

a source electrode of the first TFT is connected to the data line, a gate electrode of the first TFT is connected to the first scanning line, and a drain electrode of the first TFT is connected to the first end of the first storage capacitor; and a source electrode of the second TFT is connected to the first signal source and a source electrode of the driving transistor DTFT respectively, a gate electrode of the second TFT is connected to the first scanning line, and a drain electrode of the second TFT is connected to the second end of the first storage capacitor.

Optionally, the discharging unit may include:

a third TFT;

a source electrode of the third TFT is connected to the drain electrode of the driving transistor, a gate electrode of the third TFT is connected to the second scanning line, and a drain electrode of the third TFT is connected to the second signal source.

Optionally, the jumping unit may include:

a fourth TFT;

a source electrode of the fourth TFT is connected to the first signal source, a gate electrode of the fourth TFT is connected to the control line, and a drain electrode of the fourth TFT is connected to the first end of the first storage capacitor.

Optionally, the display driving module may further include:

a control unit, arranged to be connected to the first signal source, the second scanning line, the charging unit and the driving transistor, transmit the first signal to the charging unit within the first stage, and transmit the first signal to the drain electrode of the driving transistor within the fourth stage.

Optionally, the control unit may include:

a fifth TFT;

a source electrode of the fifth TFT is connected to the first signal source, a gate electrode of the fifth TFT is connected to the second scanning line, and a drain electrode of the fifth TFT is connected to the charging unit and a source electrode of the driving transistor respectively.

Optionally, a channel type of the third TFT may be different from a channel type of the fifth TFT.

Optionally, the in-cell touch detection module may include:

a second storage capacitor, a phototransistor and a switch transistor; wherein:

a first end of the second storage capacitor is connected to the first scanning line, a second end of the second storage capacitor is connected to a drain electrode of the phototransistor and a source electrode of the switch transistor respectively;

both a source electrode and a gate electrode of the phototransistor are connected to the first scanning line, the phototransistor is arranged to charge the second storage capacitor under the control of the first scanning signal, and generate a corresponding charging current signal based on light intensity within both the first stage and the second stage of the time period; and a gate electrode of the switch transistor is connected to the control line, a drain electrode of the switch transistor is connected to the signal reading line, the switch transistor is arranged to transmit the charging current signal generated by the phototransistor to the signal reading line under the control of the control signal, so that a processor determines information of a location of a touch operation based on the charging current signal, within the third stage of the time period.

Optionally, the first signal may be at high level, the second signal inputted by the second signal source may be at low level.

The present disclosure further provides a method for driving the pixel circuit provided in the above embodiments of the present disclosure including:

a step of display driving, including: compensating for, by the display driving module, the voltage threshold of the driving transistor by a data signal inputted by the data line and a first signal inputted by the first signal source in a time period, which is under a control of a first scanning signal inputted by the first scanning line, a second scanning signal inputted by the second scanning line, and the control signal inputted by the control line, so that a light-emitting driving signal of the OLED is independent of the voltage threshold of the driving transistor in a fourth stage of the time period; and a step of touch detection, including: detecting, by the in-cell touch detection module, a touch signal of a touch screen based on a variation of light caused by a touch operation in the time period, which is under the control of the first scanning signal inputted by the first scanning line and the control signal inputted by the control line.

Optionally, the step of display driving may include:

controlling, by the charging unit, the first storage capacitor so that a potential of a first end of the first storage capacitor is kept to be a potential of the data signal, and controlling the first storage capacitor so that a potential of the second end of the first storage capacitor is kept to be a potential of the first signal, within a first stage of the time period;

discharging, by the discharging unit, the first storage capacitor so that the potential of the second end of the first storage capacitor is decreased from the potential of the first signal to a potential being equal to the voltage threshold of the driving transistor, within a second stage of the time period; and controlling, by the jumping unit, the first storage capacitor so that the potential of the first end of the first storage capacitor becomes the potential of the first signal from the potential of the data signal, and the potential of the second end of the first storage capacitor equals to a sum of the potential of the first signal and the potential of the voltage threshold of the driving transistor minus the potential of the data signal, within a third stage of the time period.

Optionally, the step of display driving may further include: transmitting, by the control unit, the first signal to the charging unit within the first stage, and transmitting the first signal to the source electrode of the driving transistor within the fourth stage.

Optionally, in the first stage, the first scanning signal and the second scanning signal may be at high level, the data signal and the control signal may be at low level, the control unit and the charging unit may be in an ON state, and the discharging unit and the jumping unit may be in an OFF state;

in the second stage, the first scanning signal may be at high level, the second scanning signal, the data signal and the control signal may be at low level, the charging unit and the discharging unit may be in the ON state, and the control unit and the jumping unit may be in the OFF state;

in the third stage, the control signal and the data signal may be at high level, the first scanning signal and the second scanning signal may be at low level, the discharging unit and the jumping unit may be in the ON state, and the charging unit and the control unit may be in the OFF state; and in the fourth stage, the second scanning signal and the data signal may be at high level, the first scanning signal and the control signal may be at low level, the control unit may be in the ON state, and the charging unit, the discharging unit and the jumping unit may be in the OFF state.

Optionally, the step of touch detection may include:

charging, by the phototransistor, the second storage capacitor under the control of the first scanning signal, and generating a corresponding charging current signal based on light intensity within both the first stage and the second stage of the time period; and transmitting, by the switch transistor, the charging current signal generated by the phototransistor to the signal reading line under the control of the control signal, so that a processor determines information of a location of a touch operation based on the charging current signal, within the third stage of the time period.

Optionally, in both the first stage and the second stage, the first scanning signal may be at high level, the control signal may be at low level, the phototransistor may be in the ON state, and the switch transistor may be in the OFF state;

in the third stage, the first scanning signal may be at low level, the control signal may be at high level, the phototransistor may be in the OFF state, and the switch transistor may be in the ON state; and in the fourth stage, the first scanning signal and the control signal may be at low level, and the phototransistor and the switch transistor may be in the OFF state.

The present disclosure further provides an OLED display panel including the pixel circuit of the above embodiments of the present disclosure.

The present disclosure further provides a display device including the OLED display panel of the above embodiments of the present disclosure.

It can be seen from above that it is provided in the present disclosure the pixel circuit, the method for driving the pixel circuit, the organic light-emitting display panel and the display device, and the pixel circuit includes a display driving module, arranged to be connected to a first scanning line, a second scanning line, a control line, a data line, a first signal source, and a second signal source respectively, and compensate for the voltage threshold of the driving transistor by a data signal inputted by the data line and a first signal inputted by the first signal source in a time period, which is under a control of a first scanning signal inputted by the first scanning line, a second scanning signal inputted by the second scanning line, and a control signal inputted by the control line, so that a light-emitting driving signal of the OLED is independent of the voltage threshold of the driving transistor in a fourth stage of the time period; an in-cell touch detection module, arranged to be connected to the first scanning line, the control line and a signal reading line respectively, and detect a touch signal of a touch screen based on a variation of light caused by a touch operation in the time period, which is under the control of the first scanning signal inputted by the first scanning line and the control signal inputted by the control line. As a result, it is not only that the adverse impact on the light-emitting driving signal caused by the voltage threshold of the driving transistor may be eliminated, so that the uniformity of the brightness of the OLED display panel is improved and the display effect of the display device is enhanced, but also that the touch detection may be implemented while the display driving is implemented, so that the display driving and the touch detection can be efficiently integrated.

DETAILED DESCRIPTION

In order to make the objects, the technical solutions and the advantages of the present disclosure more apparent, some technical solutions of the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
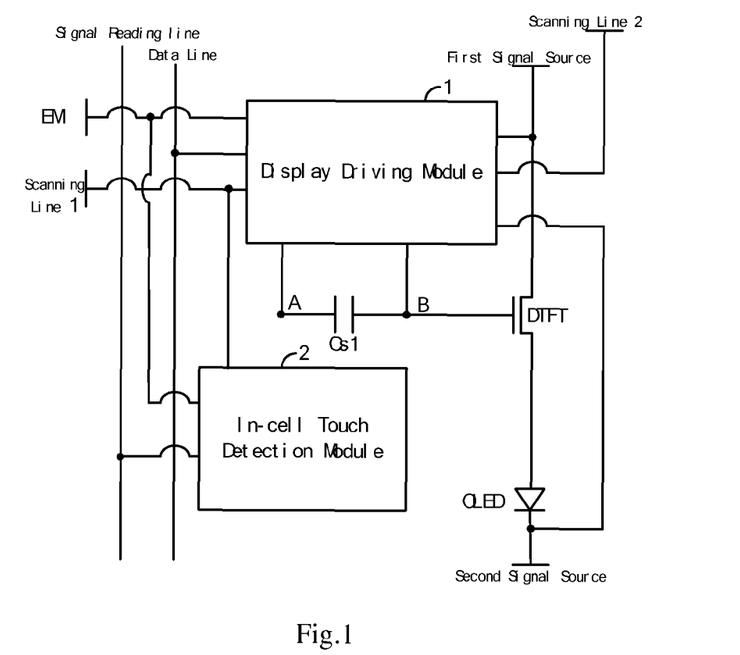
FIG. 1 is a first structure diagram of the pixel circuit according to an embodiment of the present disclosure.

In an embodiment of the present disclosure, it is provided a pixel circuit as illustrated in FIG. 1, and the pixel circuit may specifically include a first storage capacitor Cs1, a driving transistor DTFT and an OLED, wherein a gate electrode of the driving transistor DTFT is connected to a second end (i.e. a node B) of the first storage capacitor Cs1, and a drain electrode of the driving transistor DTFT is connected to an anode of the OLED.

As illustrated in FIG. 1, the pixel circuit further includes:
a display driving module 1, arranged to be connected to a first scanning line Scan1, a second scanning line Scan2, a control line EM, a data line, a first signal source, and a second signal source respectively, and compensate for the voltage threshold $V_{th}$ of the driving transistor by using a data signal $V_{data}$ inputted by the data line and a first signal $V_{dd}$ inputted by the first signal source in a time period, which is under a control of a first scanning signal $V_{Scan1}$ inputted by the first scanning line Scan1, a second scanning signal $V_{Scan2}$ inputted by the second scanning line Scan2, and a control signal $V_{EM}$ inputted by the control line EM, so that a light-emitting driving signal of the OLED is independent of the voltage threshold $V_{th}$ of the driving transistor in a fourth stage of the time period; and an in-cell touch detection module 2, arranged to be connected to the first scanning line Scan1, the control line EM and a signal reading line respectively, and detect a touch signal of a touch screen based on a variation of light caused by a touch operation in the time period, which is under the control of the first scanning signal $V_{Scan1}$ inputted by the first scanning line Scan1 and the control signal $V_{EM}$ inputted by the control line EM.

According to the pixel circuit of the present disclosure, it is not only that the adverse impact on the light-emitting driving signal caused by the voltage threshold $V_{th}$ of the driving transistor DTFT may be eliminated, so that the uniformity of the brightness of the OLED display panel is improved and the display effect of the display device is enhanced, but also that the touch detection may be implemented while the display driving is implemented, so that the display driving and the touch detection can be efficiently integrated.

As illustrated in FIG. 1, a cathode of the OLED may be connected to the second signal source in this embodiment of the present disclosure.

In this embodiment of the present disclosure, for example, the first signal $V_{dd}$ may be at high level, and the second signal inputted by the second signal source may be at low level. Alternatively, the second signal source may be the ground, and thus an input of zero potential is implemented.

Figure 2:
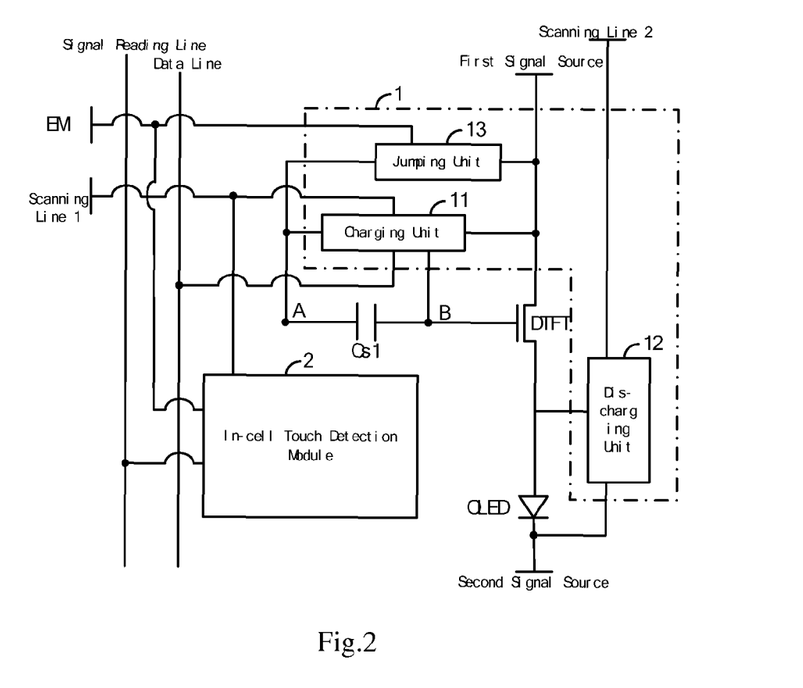
FIG. 2 is a second structure diagram of the pixel circuit according to an embodiment of the present disclosure.

As illustrated in FIG. 2, the display driving module 1 of the embodiment of the present disclosure may include:

a charging unit 11, arranged to be connected to the data line, the first scanning line Scan1, the first storage capacitor Cs1, the driving transistor DTFT and the first signal source respectively, and control the first storage capacitor Cs1 so that a potential of a first end (i.e. a node A) of the first storage capacitor Cs1 is kept to be a potential of the data signal $V_{data}$, and control the first storage capacitor Cs1 so that a potential of the second end (i.e. the node B) of the first storage capacitor Cs1 is kept to be a potential of the first signal $V_{dd}$, within a first stage of the time period;

a discharging unit 12, arranged to be connected to the driving transistor DTFT, the second scanning line Scan2 and the second signal source respectively, and discharge the first storage capacitor Cs1 so that the potential of the second end of the first storage capacitor Cs1 is decreased from the potential of the first signal $V_{dd}$ to a potential being equal to the voltage threshold $V_{th}$ of the driving transistor DTFT, within a second stage of the time period; and a jumping unit 13, arranged to be connected to the first end of the first storage capacitor Cs1, the control line EM and the first signal source respectively, and control the first storage capacitor Cs1 so that the potential of the first end of the first storage capacitor Cs1 becomes the potential of the first signal $V_{dd}$ from the potential of the data signal $V_{data}$, and the potential of the second end of the first storage capacitor Cs1 equals to a sum of the potential of the first signal $V_{dd}$ and the potential of the voltage threshold $V_{th}$ of the driving transistor DTFT minus the potential of the data signal $V_{data}$, i.e., $V_{dd}+V_{th}-V_{data}$, within a third stage of the time period.

The potential of the second end of the first storage capacitor Cs1 equals to the potential of the gate electrode of the driving transistor DTFT, and thus under the condition that the first signal is inputted into the source electrode of the driving transistor DTFT within the fourth stage, it may be obtained from the equation of the saturation current of the driving transistor DTFT that:

$$I_{OLED} = K(V_{GS} - V_{th})^2$$
$$= K[V_{dd} + V_{th} - V_{data} - V_{dd} - V_{th}]^2$$
$$= K(V_{data})^2$$

Where $V_{GS}$ indicates the source-gate voltage of the driving thin film transistor DTFT, i.e. $(V_{dd}+V_{th}-V_{data})-V_{dd}$, and K indicates a constant related to the manufacture process and the driver design of the driving thin film transistor DTFT.

It can be seen from above that the Driving signal of the OLED is independent of the voltage threshold $V_{th}$ of the driving transistor DTFT, and thus the adverse impact on the light-emitting driving signal caused by the voltage threshold $V_{th}$ of the driving transistor DTFT may be eliminated, so that the uniformity of the brightness of the OLED display panel is improved, and the display effect of the display device is enhanced.

Figure 3:
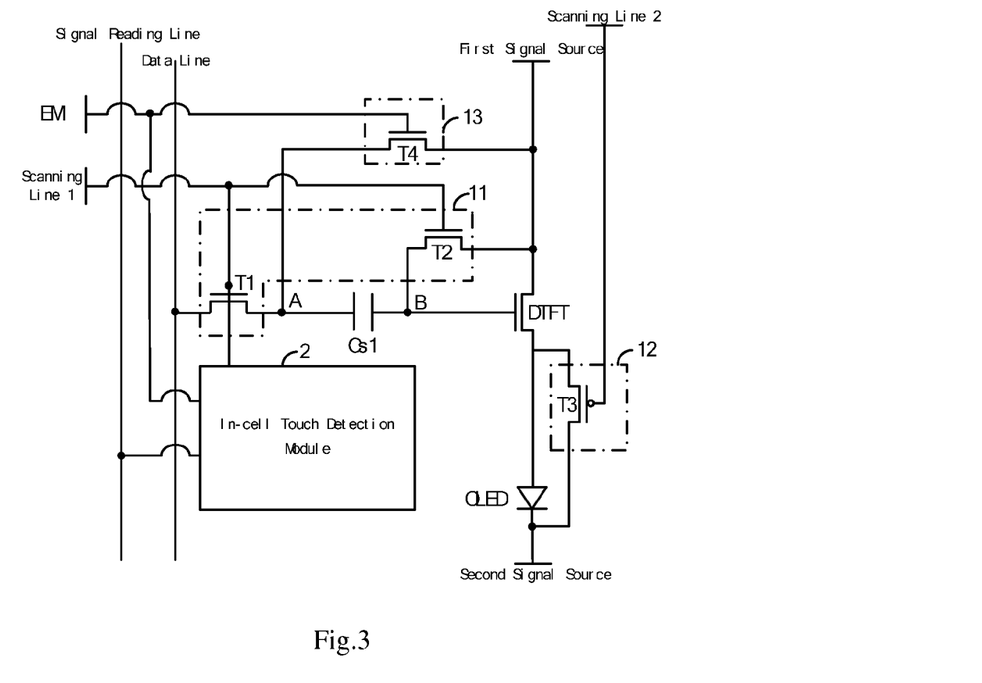
FIG. 3 is a third structure diagram of the pixel circuit according to an embodiment of the present disclosure.

In an embodiment of the present disclosure, as illustrated in FIG. 3, the charging unit 11 may include:

a first TFT T1 and a second TFT T2, wherein:

a source electrode of the first TFT T1 is connected to the data line, a gate electrode of the first TFT T1 is connected to the first scanning line Scan1, and a drain electrode of the first TFT T1 is connected to the first end of the first storage capacitor Cs1; and a source electrode of the second TFT T2 is connected to the first signal source and a source electrode of the driving transistor DTFT respectively, a gate electrode of the second TFT T2 is connected to the first scanning line Scan1, and a drain electrode of the second TFT T2 is connected to the second end of the first storage capacitor Cs1.

In an embodiment of the present disclosure, as illustrated in FIG. 3, the discharging unit 12 may include:

a third TFT T3; wherein a source electrode of the third TFT T3 is connected to the drain electrode of the driving transistor DTFT, a gate electrode of the third TFT T3 is connected to the second scanning line Scan2, and a drain electrode of the third TFT T3 is connected to the second signal source.

In an embodiment of the present disclosure, as illustrated in FIG. 3, the jumping unit 13 may include:

a fourth TFT T4; wherein a source electrode of the fourth TFT T4 is connected to the first signal source, a gate electrode of the fourth TFT T4 is connected to the control line EM, and a drain electrode of the fourth TFT T4 is connected to the first end of the first storage capacitor Cs1.

Figure 4:
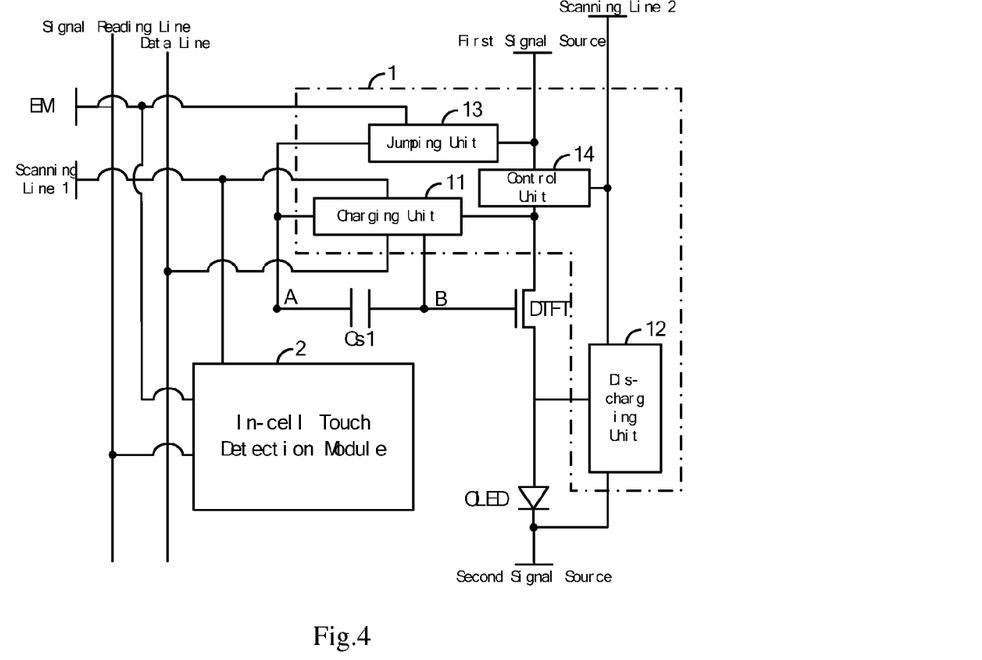
FIG. 4 is a fourth structure diagram of the pixel circuit according to an embodiment of the present disclosure.

As illustrated in FIG. 4, the display driving module 1 of the embodiment of the present disclosure may further include:

a control unit 14, arranged to be connected to the first signal source, the second scanning line Scan2, the charging unit 11 and a driving thin film transistor DTFT, and transmit the first signal $V_{dd}$ to the charging unit 11 within the first stage, and transmit the first signal $V_{dd}$ to the source electrode of the driving transistor DTFT within the fourth stage.

Figure 5:
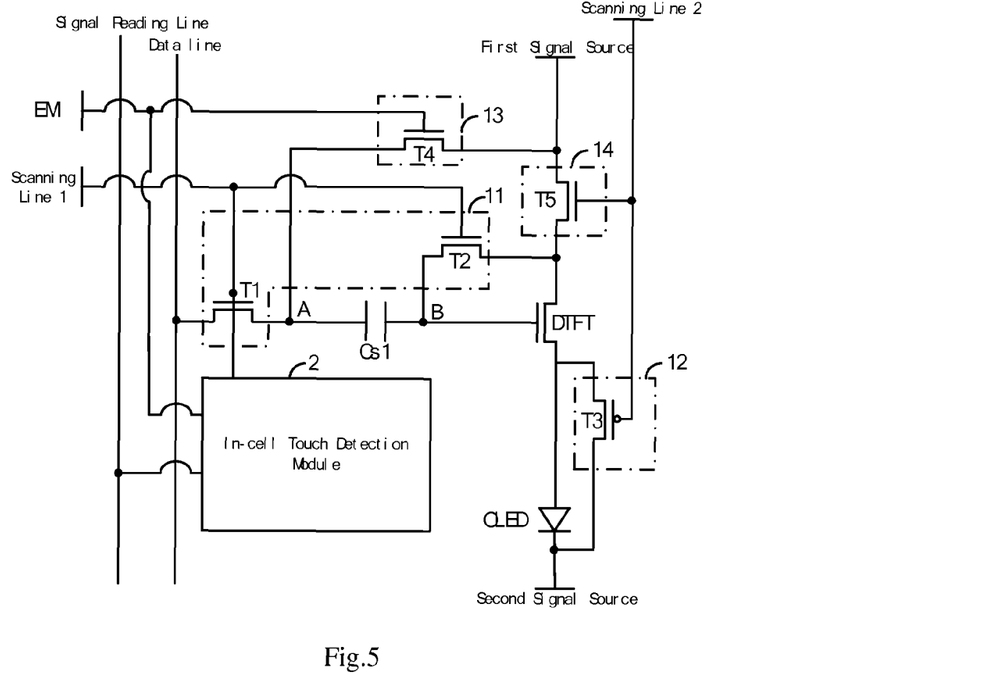
FIG. 5 is a fifth structure diagram of the pixel circuit according to an embodiment of the present disclosure.

In an embodiment of the present disclosure, as illustrated in FIG. 5, the control unit 14 may include:

a fifth TFT T5;

a source electrode of the fifth TFT T5 is connected to the first signal source, a gate electrode of the fifth TFT T5 is connected to the second scanning line Scan2, and a drain electrode of the fifth TFT T5 is connected to the charging unit 11 and a source electrode of the driving transistor DTFT respectively.

It is appreciated that, in this embodiment of the present disclosure, the control unit 14 is an optional device. In another embodiment of the present disclosure, the function of the control unit 14 may be implemented and replaced by controlling the input sequence of the first signal.

In this embodiment of the present disclosure, both the discharging unit 12 and the control unit 14 are controlled by the first signal inputted by the first signal source, however, the discharging unit 12 and the control unit 14 each operates at different stages. Thus, for the normal operation of each of the discharging unit 12 and the control unit 14, the type of the channel of the third TFT T3 in the discharging unit 12 may be different from the type of the channel of the fifth TFT in the control unit 14. In particular, the third TFT T3 may be a P-type transistor, while the fifth TFT T5 may be a N-type transistor.

In addition, in this embodiment of the present disclosure, the type of the channels of other TFTs except the third TFT T3 may be the N type.

Figure 6:
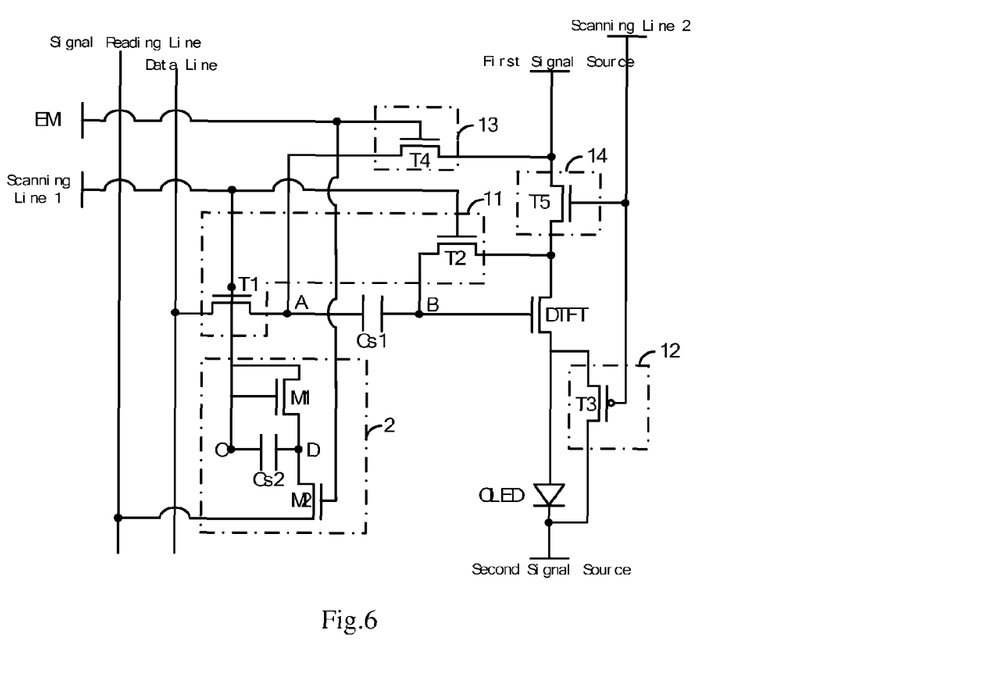
FIG. 6 is a sixth structure diagram of the pixel circuit according to an embodiment of the present disclosure.

As illustrated in FIG. 6, the in-cell touch detection module 2 of the embodiment of the present disclosure may include:

a second storage capacitor Cs2, a phototransistor M1 and a switch transistor M2; wherein:

a first end of the second storage capacitor Cs2 is connected to the first scanning line Scan1, a second end of the second storage capacitor Cs2 is connected to a drain electrode of the phototransistor M1 and a source electrode of the switch transistor M2 respectively;

both a source electrode and a gate electrode of the phototransistor M1 are connected to the first scanning line Scan1, the phototransistor M1 is arranged to charge the second storage capacitor Cs2 under the control of the first scanning signal $V_{Scan1}$, and generate a corresponding charging current signal based on light intensity within both the first stage and the second stage of the time period;

a gate electrode of the switch transistor M2 is connected to the control line EM, a drain electrode of the switch transistor M2 is connected to the signal reading line, the switch transistor M2 is arranged to transmit the charging current signal generated by the phototransistor M1 to the signal reading line under the control of the control signal $V_{EM}$, so that a processor can determine information of a location of a touch operation based on the charging current signal, and the processor being located at downstream of the signal reading line, within the third stage of the time period.

In particular, when the switch transistor M2 is in the ON state, the charges stored at the second end (i.e. the node D as illustrated in FIG. 6) of the second storage capacitor Cs2 may be released, such a signal may be transmitted to an amplifier (not shown) at the downstream of the signal reading line, and the amplified signal by the amplifier may be transmitted to the processor (not shown) for data calculating and analyzing.

If a touch operation is implemented in this time period, the light irradiating on the phototransistor M1 is weak due to light blocking by the touch operation, so that the voltage of charges stored in the second storage capacitor Cs2 varies, and thus the current transmitted to the signal reading line varies too. The processor may compare a difference of the intensities of the photoelectric signals before and after the touch with a no-touch threshold, and thus determines whether the touch screen has been touched based on the difference (the variation of the intensity of the light irradiation). Furthermore, it is assumed that an X-axis of a coordinate may be determined from the output point of the control signal $V_{EM}$, and a Y-axis of the coordinate may be determined from the signal reading line, so that the location information of the area being touched on the touch screen may be determined based on the X-axis and the Y-axis.

It can be seen from above that, in this embodiment of the present disclosure, a touch signal detection circuit of an embedded touch screen may be incorporated in the pixel unit, and the detection of the touch signal may be implemented while driving the display; thus, the configuration of the integration of the pixel driving circuit and the touch signal detection circuit may be implemented, and the display driving and the touch detection are efficiently integrated. In such a circuit configuration, the embedded touch screen and the OLED driving display are integrated, so that a thickness and a weight of the display panel are reduced, and the cost of the display panel is reduced too.

In particular, the present disclosure further provides a method for driving the pixel circuit provided in the above embodiments of the present disclosure including:

compensating for, by the display driving module 1, the voltage threshold $V_{th}$ of the driving transistor by using a data signal $V_{data}$ inputted by the data line and a first signal $V_{dd}$ inputted by the first signal source in a time period, which is under a control of a first scanning signal $V_{Scan1}$ inputted by the first scanning line Scan1, a second scanning signal $V_{Scan2}$ inputted by the second scanning line, and a control signal $V_{EM}$ inputted by the control line EM, so that a light-emitting driving signal of the OLED is independent of the voltage threshold $V_{th}$ of the driving transistor DTFT within a fourth stage of the time period; and detecting, by the in-cell touch detection module 2, a touch signal of a touch screen based on a variation of light caused by a touch operation in the time period, which is under the control of the first scanning signal $V_{Scan1}$ inputted by the first scanning line Scan1 and the control signal $V_{EM}$ inputted by the control line EM.

According to the pixel circuit of the present disclosure, it is not only that the adverse impact on the light-emitting driving signal caused by the voltage threshold $V_{th}$ of the driving transistor DTFT may be eliminated, so that the uniformity of the brightness of the OLED display panel is improved and the display effect of the display device is enhanced, but also that the touch detection may be implemented while the display driving is implemented, so that the display driving and the touch detection may be efficiently integrated.

Figure 7:
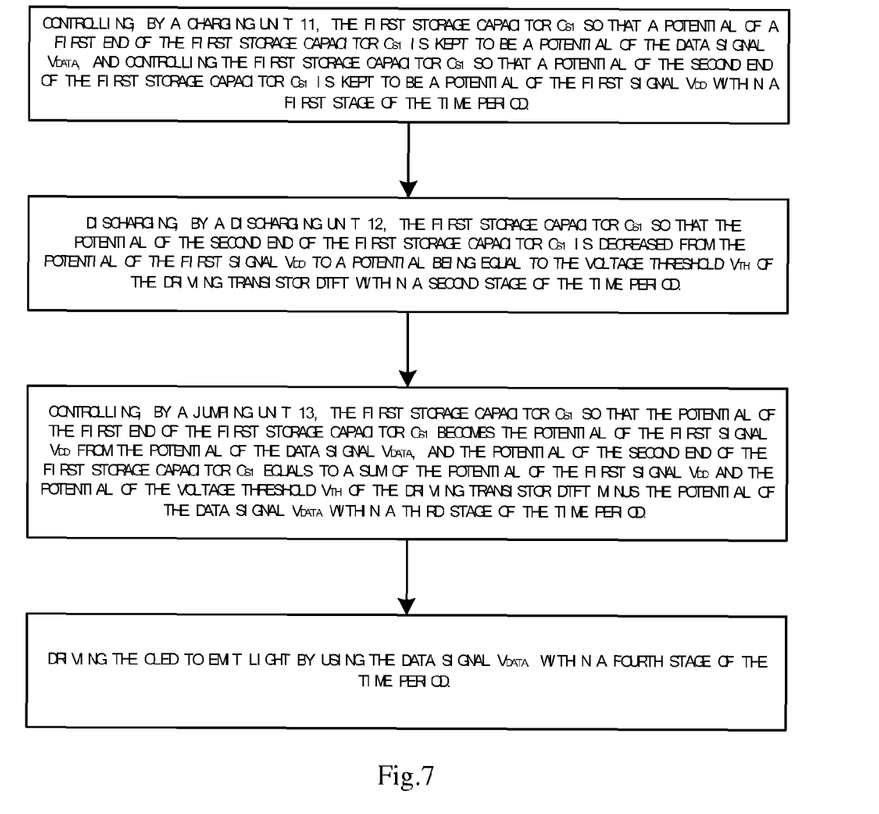
FIG. 7 is a first flow chart of the method for driving the pixel according to an embodiment of the present disclosure.

In an embodiment of the present disclosure, as illustrated in FIG. 7, the process of the display driving may specifically include:

controlling, by a charging unit 11, the first storage capacitor Cs1 so that a potential of a first end of the first storage capacitor Cs1 is kept to be a potential of the data signal $V_{data}$, and controlling the first storage capacitor Cs1 so that a potential of the second end of the first storage capacitor Cs1 is kept to be a potential of the first signal $V_{dd}$, within a first stage of the time period;

discharging, by a discharging unit 12, the first storage capacitor Cs1 so that the potential of the second end of the first storage capacitor Cs1 is decreased from the potential of the first signal $V_{dd}$ to a potential being equal to the voltage threshold $V_{th}$ of the driving transistor DTFT, within a second stage of the time period;

controlling, by a jumping unit 13, the first storage capacitor Cs1 so that the potential of the first end of the first storage capacitor Cs1 becomes the potential of the first signal $V_{dd}$ from the potential of the data signal $V_{data}$, and the potential of the second end of the first storage capacitor Cs1 equals to a sum of the potential of the first signal $V_{dd}$ and the potential of the voltage threshold $V_{th}$ of the driving transistor DTFT minus the potential of the data signal $V_{data}$, within a third stage of the time period; and driving the OLED to emit light by using the data signal $V_{data}$, within a fourth stage of the time period.

As a result, in this embodiment of the present disclosure, the driving signal of the OLED is independent of the voltage threshold $V_{th}$ of the driving transistor DTFT, and thus the adverse impact on the light-emitting driving signal caused by the voltage threshold $V_{th}$ of the driving transistor DTFT may be eliminated, so that the uniformity of the brightness of the OLED display panel is improved, and the display effect of the display device is enhanced.

In an embodiment of the present disclosure, the process of display driving may further include:

transmitting, by a control unit 14, the first signal $V_{dd}$ to the charging unit 11 within the first stage, and transmitting the first signal $V_{dd}$ to the source electrode of the driving transistor DTFT within the fourth stage.

Figure 8:
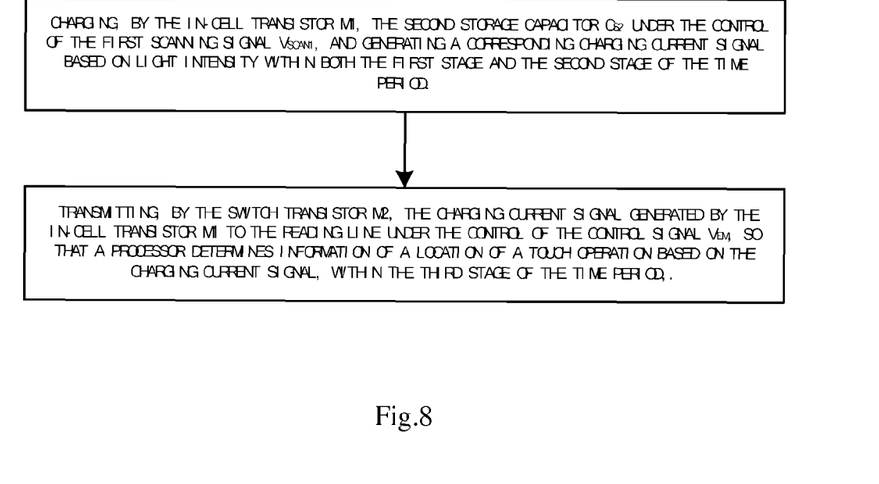
FIG. 8 is a second flow chart of the method for driving the pixel according to an embodiment of the present disclosure.

In an embodiment of the present disclosure, as illustrated in FIG. 8, the process of the touch detection may specifically include:

charging, by the phototransistor M1, the second storage capacitor Cs2 under the control of the first scanning signal $V_{Scan1}$, and generating a corresponding charging current signal based on light intensity within both the first stage and the second stage of the time period; and transmitting, by the switch transistor M2, the charging current signal generated by the phototransistor M1 to the signal reading line under the control of the control signal $V_{EM}$, so that a processor determines information of a location of a touch operation based on the charging current signal, within the third stage of the time period.

It can be seen from above that, in this embodiment of the present disclosure, a touch signal detection circuit of an embedded touch screen may be incorporated in the pixel unit, and the detection of the touch signal may be implemented while driving the display; thus, the configuration of the integration of the pixel driving circuit and the touch signal detection circuit may be implemented, and the display driving and the touch detection are efficiently integrated. In such a circuit configuration, the embedded touch screen and the OLED driving display are integrated, so that a thickness and a weight of the display panel are reduced, and the cost of the display panel is reduced too.

In the following, a specific embodiment of the process of the method for driving the pixel is explained in details by taking the method for driving the pixel of the present embodiment applied to the pixel circuit shown in FIG. 6 as an example.

Figure 9:
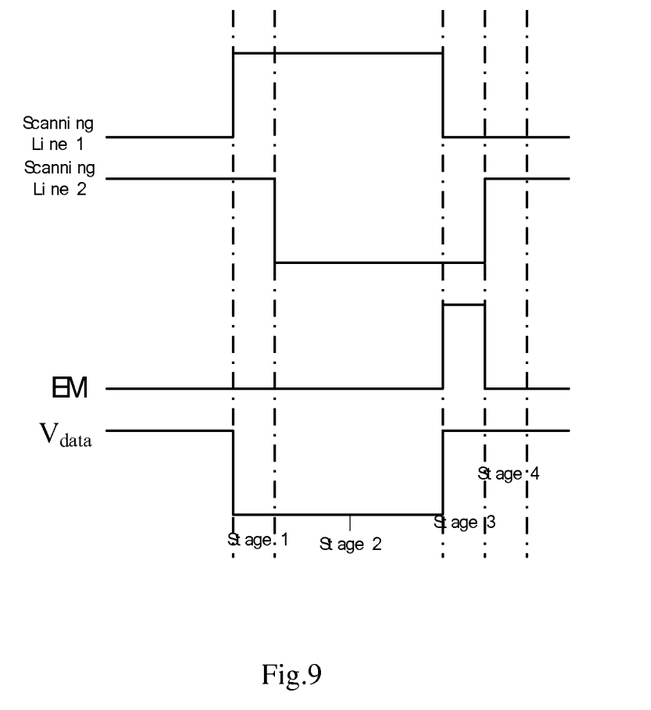
FIG. 9 is a sequence diagram of the signal of the method for driving the pixel according to an embodiment of the present disclosure.

The input sequence of signals of the embodiment is illustrated in FIG. 9.

In this embodiment, the process may include:

a first stage:

Within this stage, the display driving module 1 is in a stage of being charged, and the in-cell touch detection module 2 is in a stage of storing current signal.

Within this stage, the signal input is illustrated in stage 1 of FIG. 9, i.e. the first scanning signal $V_{Scan1}$ and the second scanning signal are at high level, and the data signal $V_{data}$ and the control signal $V_{EM}$ are at low level, so that the first TFT T1 and the second TFT T2 (the charging unit 11), the fifth TFT T5 (the control unit 14) are in the ON state, while the third TFT T3 (the discharging unit 12) and the fourth TFT T4 (the jumping unit 13) are in the OFF state.

Figure 10:
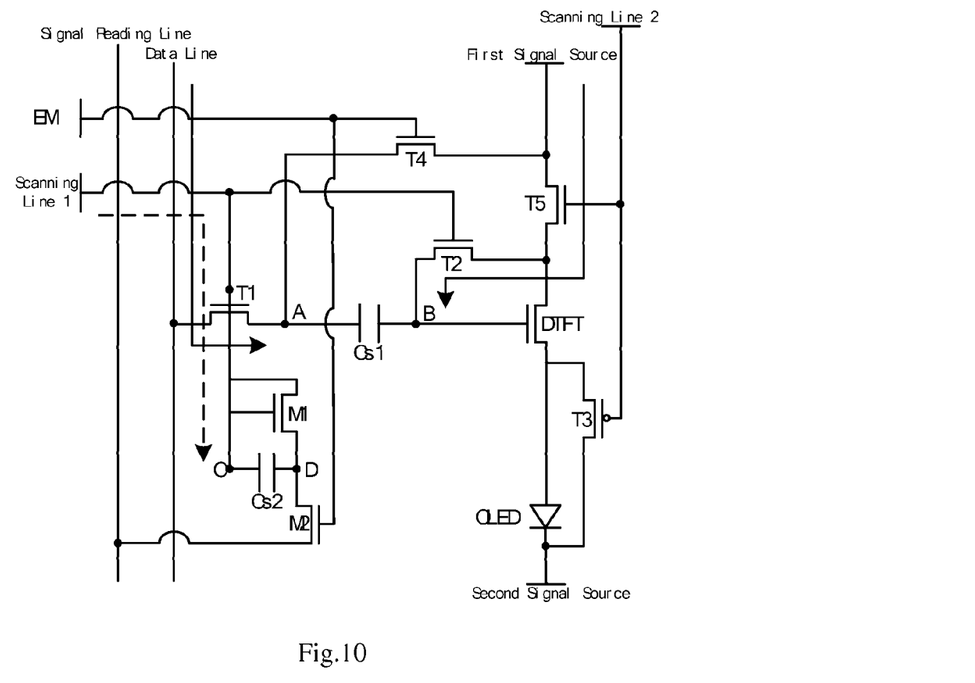
FIG. 10 is a first state diagram of the pixel circuit in the first stage according to an embodiment of the present disclosure.

Thus in this stage, as indicated by an arrow with a solid line in FIG. 10, the first end (i.e. the node A) of the first storage capacitor Cs1 is charged to the potential of the data signal $V_{data}$ by using the data signal $V_{data}$ via the first TFT T1, and the second end of the first storage capacitor is charged to the potential of the first signal $V_{dd}$ by using the first signal $V_{dd}$ via the fifth TFT T5 and the second TFT T2.

In addition, as indicated by an arrow with dashed lines, the first end (i.e. the node C) of the second storage capacitor Cs2 in the in-cell touch detection module 2 is charged by the first canning line $V_{Scan1}$, and the phototransistor M1 in the in-cell touch detection module 2 is turned to be in the ON state; since the gate electrode and the source electrode of the phototransistor M1 are connected, the second end (i.e. the node D) of the second storage capacitor Cs2 is further charged by the first scanning signal $V_{Scan1}$ via the phototransistor M1; the phototransistor M1 may increase the current running through therein based on the increase of the intensity of the irradiation light received by the phototransistor M1, while the potential difference of the second storage capacitor Cs2 is a constant within this stage and prepared for the current signal reading stage.

a second stage:

Within this stage, the display driving module 1 is in a stage of being discharged, and the in-cell touch detection module 2 is still in the stage of storing the current signal.

Within this stage, the signal input is illustrated in stage 2 of FIG. 9, i.e. the first scanning signal $V_{Scan1}$ is at high level, and the second scanning signal $V_{Scan2}$, the data signal $V_{data}$ and the control signal $V_{EM}$ are at low level, so that the first TFT T1 and the second TFT T2 (the charging unit 11), the third TFT T3 (the discharging unit 12), and the phototransistor M1 are in the ON state, while and the fourth TFT T4 (the jumping unit 13), the fifth TFT T5 (the control unit) and the switch transistor M2 are in the OFF state.

Figure 11:
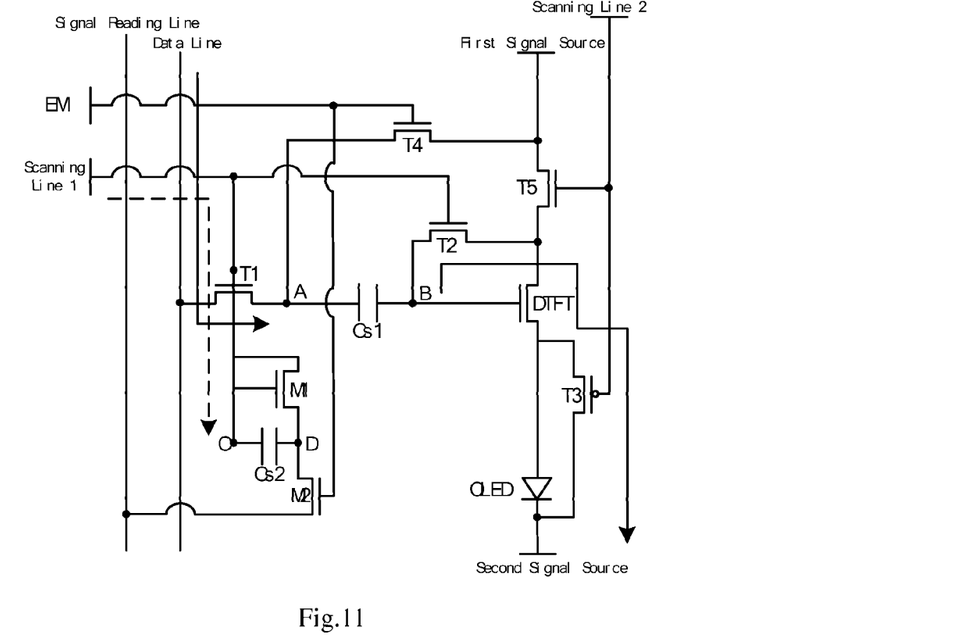
FIG. 11 is a second state diagram of the pixel circuit in the second stage according to an embodiment of the present disclosure.

As indicated by an arrow with a solid line in FIG. 11, since the first TFT T1 is turned on, the potential of the first end (i.e. the node A) of the first storage capacitor Cs1 remains at the potential of the data signal $V_{data}$, while since the third TFT T3 is turned on, the discharging unit 12 begins to discharge from the second end (i.e. the node B) of the first storage capacitor Cs1, until the potential of the node B becomes the potential of the voltage threshold $V_{th}$ of the driving transistor DTFT.

As illustrated in FIG. 9, the duration of the second stage is relatively long, which is because that, in one aspect, the discharging may be complete; and in another aspect, the voltage difference between the node A and the node B may be stabilized.

Within the second stage, the third TFT T3 is turned on, and thus the current may not run through the OLED, so that the deterioration of the OLED is reduced, and the life span of the OLED can be extended.

As indicated by an arrow with dashed lines, the condition of the in-cell touch detection module 2 is same as that in the first stage, i.e. remains in the stage of storing the current signal. Due to the fact that it is necessary for the phototransistor M1 to absorb enough light to generate stable photoelectric current, the duration of storing the current signal traverses the first and the second stages.

a third stage:

Within this stage, the display driving module 1 is in a stage of jumping, and the in-cell touch detection module 2 is in a stage of reading current signal.

Within this stage, the signal input is illustrated in stage 3 of FIG. 9, i.e. the control signal $V_{EM}$ and the data signal $V_{data}$ are at high level, and the first scanning signal $V_{Scan1}$ and the second scanning signal $V_{Scan2}$ are at low level, so that the third TFT T3 (the discharging unit 12), the fourth TFT T4 (the jumping unit 13) and the switch transistor M2 are in the ON state, while the first TFT T1 and the second TFT T2 (the charging unit 11), the fifth TFT T5 (the control unit 14) and the phototransistor M1 are in the OFF state.

Figure 12:
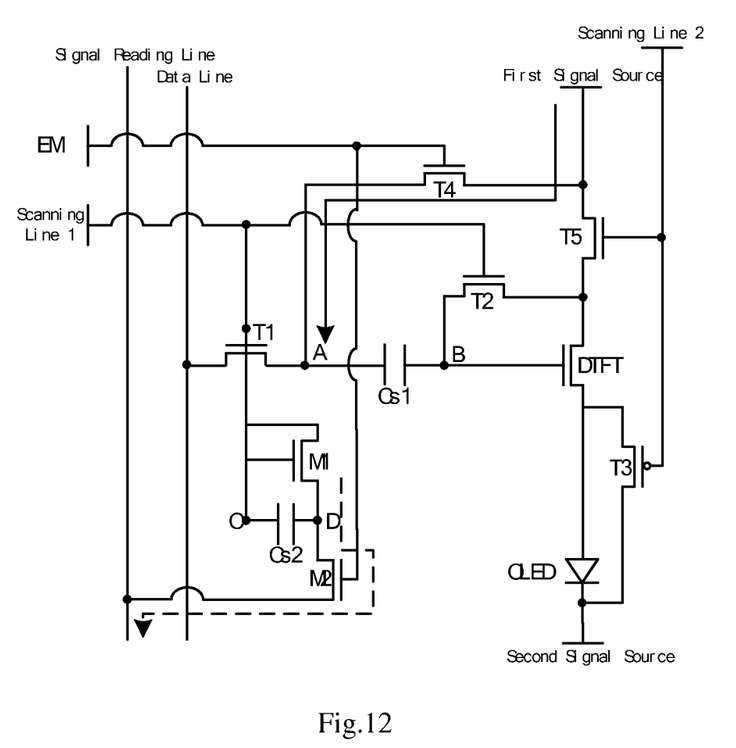
FIG. 12 is a third state diagram of the pixel circuit in the third stage according to an embodiment of the present disclosure.

As indicated by an arrow with a solid line in FIG. 12, since the fourth TFT T4 is turned on, the first signal $V_{dd}$ is transmitted to the node A, so that the potential of the node A jumps from the potential of the data signal $V_{data}$ to the potential of the first signal $V_{dd}$, i.e. $V_{data} \to V_{dd}$. Since the second TFT T2 is turned off, and the potential of the node B has been discharged to $V_{th}$ in the second stage, the node B is in a suspension state, and a jump with equivalent voltage is implemented between the node A and the node B (the voltage difference, i.e. $V_{th}-V_{data}$ in the second stage is retained). Thus, the potential of the node B within the third stage is $V_{dd}+V_{th}-V_{data}$, which is prepared for the next stage, i.e. the stage of emitting light.

As indicated by an arrow with dashed lines, due to the control signal $V_{EM}$, the switch transistor M2 is in the ON state, the current signal stored at the second end (i.e. the node D) of the second storage capacitor Cs2 is released to the signal reading line, such a signal is transmitted to the amplifier connected at the downstream of the signal reading line, and the amplified signal is transmitted to the processor for data calculating and analyzing.

If a touch operation is implemented in this time period, the light irradiating on the phototransistor M1 is weak due to light blocking by the touch operation, so that the voltage of charges stored in the second storage capacitor Cs2 varies, and thus the current transmitted to the signal reading line varies too. The processor may compare a difference of the intensities of the photoelectric signals before and after the touch with a no-touch threshold, and thus determines whether the touch screen has been touched based on the difference. Furthermore, it is assumed that an X-axis of a coordinate may be determined from the output point of the control signal $V_{EM}$, and a Y-axis of the coordinate may be determined from the signal reading line, so that the location information of the area being touched on the touch screen may be determined based on the X-axis and the Y-axis.

a fourth stage:

Within this stage, the display driving module 1 is in a stage of emitting light, and the in-cell touch detection module 2 is in a stage of suspension.

Within this stage, the signal input is illustrated in stage 4 of FIG. 9, i.e. the second scanning signal $V_{Scan2}$ and the data signal $V_{data}$ are at high level, and the first scanning signal $V_{Scan1}$ and the control signal $V_{EM}$ are at low level, so that the fifth TFT T5 (the control unit 14) is in the ON state, while the first TFT T1 and the second TFT T2 (the charging unit 11), the third TFT T3 (the discharging unit 12), the fourth TFT T4 (the jump unit 13), the phototransistor M1 and the switch transistor M2 are in the OFF state.

Figure 13:
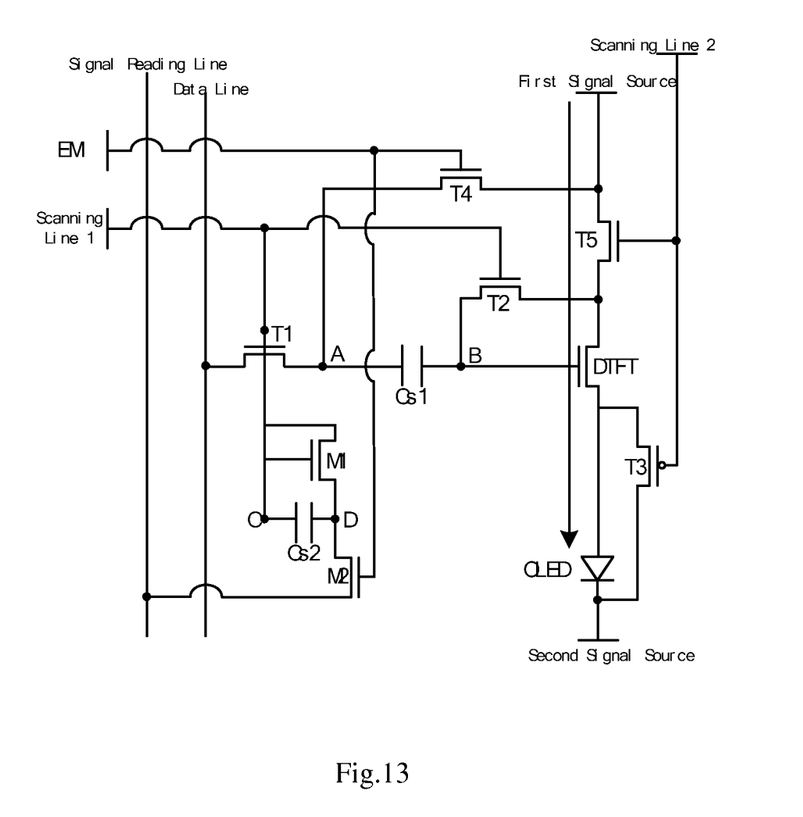
FIG. 13 is a fourth state diagram of the pixel circuit in the fourth stage according to an embodiment of the present disclosure.

As indicated by an arrow with a solid line in FIG. 13, since the fifth TFT T5 is in the ON state, the first signal $V_{dd}$ is transmitted to the source electrode of the driving thin film transistor DTFT, the potential of the gate electrode of the driving transistor DTFT equals to the potential of the node B. Thus, it may be obtained from the equation of the saturation current of the driving transistor DTFT that:

$$I_{OLED} = K(V_{GS} - V_{th})^2$$
$$= K[V_{dd} + V_{th} - V_{data} - V_{dd} - V_{th}]^2$$
$$= K(V_{data})^2$$

Where $V_{GS}$ indicates the source-gate voltage of the driving thin film transistor DTFT, i.e. $(V_{dd}+V_{th}-V_{data})-V_{dd}$, and K indicates a constant related to the manufacture process and the driver design of the driving thin film transistor DTFT.

It can be seen from above that the operation current $I_{OLED}$ of the OLED is independent of the voltage threshold $V_{th}$ of the driving transistor DTFT, and merely relates to the data signal $V_{data}$. As a result, it is solved the problem of the drift of the voltage threshold $V_{th}$ of the driving transistor DTFT caused by the manufacture process and long time operation, and the adverse impact on the operation current $I_{OLED}$ of the OLED by the voltage threshold $V_{th}$ of the driving transistor DTFT may be eliminated, and the normal operation of the OLED is guaranteed.

Within the fourth stage, all the devices in the in-cell touch detection module 2 do not operate. Within this stage, the display driving module 1 drives the OLED to emit light, and thus the adverse impact on the display driving by the touch detection is reduced.

According to the method for driving the pixel of the present disclosure, it is not only that the adverse impact on the light-emitting driving signal caused by the voltage threshold $V_{th}$ of the driving transistor DTFT is eliminated, so that the uniformity of the brightness of the OLED display panel is improved and the display effect of the display device is enhanced, but also that the touch detection may be implemented while the display driving is implemented, so that the display driving and the touch detection may be efficiently integrated.

Based on the above pixel circuits, it is also provided an OLED display panel in the embodiment of the present disclosure, which includes any one of the above pixel circuits.

In the embodiment of the present disclosure, it is further provided a display device including the OLED display panel of the above embodiment of the present disclosure.

The display device includes the LCD panel, the LCD TV, the LCD monitor, the OLED panel, the OLED monitor, the plasma monitor, the electronic paper, and etc.

The pixel circuit, the OLED display panel and the display device particularly satisfy the requirement of manufacturing the Gate Driver on Array (GOA) circuit by the process of low-temperature poly-silicon (LTPS).

It can be seen from above that it is provided in the present disclosure the pixel circuit, the method for driving the pixel circuit, the organic light-emitting display panel and the display device. And the pixel circuit includes a display driving module, arranged to be connected to a first scanning line, a second scanning line, a control line, a data line, a first signal source, and a second signal source respectively, and compensate for the voltage threshold of the driving transistor by a data signal inputted by the data line and a first signal inputted by the first signal source in a time period, which is under a control of a first scanning signal inputted by the first scanning line, a second scanning signal inputted by the second scanning line, and a control signal inputted by the control line, so that a light-emitting driving signal of the OLED is independent of the voltage threshold of the driving transistor, within a fourth stage of the time period; an in-cell touch detection module, arranged to be connected to the first scanning line, the control line and a signal reading line respectively, and detect a touch signal of a touch screen based on a variation of light caused by a touch operation in the time period, which is under the control of the first scanning signal inputted by the first scanning line and the control signal inputted by the control line.

In the above technical solutions of the embodiments of the present disclosure, the driving signal of the OLED is independent of the voltage threshold $V_{th}$ of the driving transistor DTFT, and thus the adverse impact on the light-emitting driving signal caused by the voltage threshold $V_{th}$ of the driving transistor DTFT may be eliminated, so that the uniformity of the brightness of the OLED display panel is improved, and the display effect of the display device is enhanced.

In these embodiments of the present disclosure, a touch signal detection circuit of an embedded touch screen may be incorporated in the pixel unit, and the detection of the touch signal may be implemented while driving the display; thus the configuration of the integration of the pixel driving circuit and the touch signal detection circuit may be implemented. In such a circuit configuration, the embedded touch screen and the OLED driving display are integrated, so that a thickness and a weight of the display panel are reduced, and the cost of the display panel is reduced too.

Furthermore, in these embodiments of the present disclosure, it is avoided that the current runs through the OLED for a long time, so that the deterioration of the OLED is reduced, and the life span of the OLED can be extended.

Furthermore, in these embodiments of the present disclosure, the in-cell touch detection module 2 is in the stage of suspension when the display driving module 1 drives the OLED to emit light. Thus, the adverse impact on the display driving by the touch detection is reduced, and the display driving and the touch detection are efficiently integrated.

It is appreciated that each of amorphous silicon TFT, polycrystalline silicon TFT, oxide TFT and etc. may be applicable to the pixel circuit of the present disclosure. In addition, it is obvious for those skilled in the art that the above circuit may be implemented by the N-type TFTs, the P-type TFTs, the CMOS transistors, and etc. In addition, although the above embodiments are explained with the AMOLED, the present disclosure is not limited thereto; instead, the present disclosure may also applicable to the display device with any of other types of LEDs.

The optional embodiments of the present disclosure have been discussed. It is appreciated that many modifications and polishes may be made to the present disclosure without departing from the principle of the present disclosure for those skilled in the art. These modifications and polishes should also be deemed to be fallen within the scope of the present disclosure.

What is claimed is:

1. A pixel circuit, comprising a first storage capacitor, a driving transistor and an organic light-emitting diode (OLED), wherein a gate electrode of the driving transistor is connected to a second end of the first storage capacitor, and a drain electrode of the driving transistor is connected to an anode of the OLED, wherein the pixel circuit further comprises:

a display driving module, arranged to be connected to a first scanning line, a second scanning line, a control line, a data line, a first signal source, and a second signal source respectively, and compensate for the voltage threshold of the driving transistor by using a data signal inputted by the data line and a first signal inputted by the first signal source in a time period, which is under a control of a first scanning signal inputted by the first scanning line, a second scanning signal inputted by the second scanning line, and a control signal inputted by the control line, so that a light-emitting driving signal of the OLED is independent of the voltage threshold of the driving transistor in a fourth stage of the time period; and an in-cell touch detection module, arranged to be connected to the first scanning line, the control line and a signal reading line respectively, and detect a touch signal of a touch screen based on a variation of light caused by a touch operation in the time period, which is under the control of the first scanning signal inputted by the first scanning line and the control signal inputted by the control line.

2. The pixel circuit according to claim 1, wherein the display driving module comprises:

a charging unit, arranged to be connected to the data line, the first scanning line, the first storage capacitor, the driving transistor and the first signal source respectively, and control the first storage capacitor so that a potential of a first end of the first storage capacitor is kept to be a potential of the data signal, and control the first storage capacitor so that a potential of the second end of the first storage capacitor is kept to be a potential of the first signal, within a first stage of the time period;

a discharging unit, arranged to be connected to the driving transistor, the second scanning line and the second signal source respectively, and discharge the first storage capacitor so that the potential of the second end of the first storage capacitor is decreased from the potential of the first signal to a potential being equal to the voltage threshold of the driving transistor, within a second stage of the time period; and a jumping unit, arranged to be connected to the first end of the first storage capacitor, the control line and the first signal source respectively, and control the first storage capacitor so that the potential of the first end of the first storage capacitor becomes the potential of the first signal from the potential of the data signal, and the potential of the second end of the first storage capacitor equals to a sum of the potential of the first signal and the potential of the voltage threshold of the driving transistor minus the potential of the data signal, within a third stage of the time period.

3. The pixel circuit according to claim 2, wherein the charging unit comprises:

a first thin film transistor (TFT) and a second TFT, wherein:
a source electrode of the first TFT is connected to the data line, a gate electrode of the first TFT is connected to the first scanning line, and a drain electrode of the first TFT is connected to the first end of the first storage capacitor; and
a source electrode of the second TFT is connected to the first signal source and a source electrode of the driving transistor respectively, a gate electrode of the second TFT is connected to the first scanning line, and a drain electrode of the second TFT is connected to the second end of the first storage capacitor.

4. The pixel circuit according to claim 3, wherein the charging unit comprises:
a third TFT;
wherein a source electrode of the third TFT is connected to the drain electrode of the driving transistor, a gate electrode of the third TFT is connected to the second scanning line, and a drain electrode of the third TFT is connected to the second signal source.

5. The pixel circuit according to claim 3, wherein the jumping unit comprises:
a fourth TFT;
wherein a source electrode of the fourth TFT is connected to the first signal source, a gate electrode of the fourth TFT is connected to the control line, and a drain electrode of the fourth TFT is connected to the first end of the first storage capacitor.

6. The pixel circuit according to claim 2, wherein the charging unit comprises:
a third TFT;
wherein a source electrode of the third TFT is connected to the drain electrode of the driving transistor, a gate electrode of the third TFT is connected to the second scanning line, and a drain electrode of the third TFT is connected to the second signal source.

7. The pixel circuit according to claim 2, wherein the jumping unit comprises:
a fourth TFT;
wherein a source electrode of the fourth TFT is connected to the first signal source, a gate electrode of the fourth TFT is connected to the control line, and a drain electrode of the fourth TFT is connected to the first end of the first storage capacitor.

8. The pixel circuit according to claim 2, wherein the display driving module further comprises:
a control unit, arranged to be connected to the first signal source, the second scanning line, the charging unit and the driving transistor, transmit the first signal to the charging unit within the first stage, and transmit the first signal to a source electrode of the driving transistor within the fourth stage.

9. The pixel circuit according to claim 8, wherein the control unit comprises:
a fifth TFT;
wherein a source electrode of the fifth TFT is connected to the first signal source, a gate electrode of the fifth TFT is connected to the second scanning line, and a drain electrode of the fifth TFT is connected to the charging unit and a source electrode of the driving transistor respectively.

10. The pixel circuit according to claim 9, wherein the control unit comprises a third TFT; wherein:
a source electrode of the third TFT is connected to the drain electrode of the driving transistor, a gate electrode of the third TFT is connected to the second scanning line, and a drain electrode of the third TFT is connected to the second signal source; and
a channel type of the third TFT is different from a channel type of the fifth TFT.

11. A method for driving the pixel circuit according to claim 8, comprising:
a step of display driving, comprising:
compensating for, by the display driving module, the voltage threshold of the driving transistor by the data signal inputted by the data line and the first signal inputted by the first signal source in the time period, which is under a control of the first scanning signal inputted by the first scanning line, the second scanning signal inputted by the second scanning line, and the control signal inputted by the control line, so that the light-emitting driving signal of the OLED is independent of the voltage threshold of the driving transistor, within the fourth stage of the time period; and
a step of touch detection, comprising:
detecting, by the in-cell touch detection module, the touch signal of a touch screen based on the variation of light caused by the touch operation in the time period, which is under the control of the first scanning signal inputted by the first scanning line and the control signal inputted by the control line.

12. The method according to claim 11, wherein the step of display driving comprises:
controlling, by the charging unit, the first storage capacitor so that a potential of a first end of the first storage capacitor is kept to be a potential of the data signal, and controlling the first storage capacitor so that a potential of the second end of the first storage capacitor is kept to be a potential of the first signal, within a first stage of the time period;
discharging, by the discharging unit, the first storage capacitor so that the potential of the second end of the first storage capacitor is decreased from the potential of the first signal to a potential being equal to the voltage threshold of the driving transistor, within a second stage of the time period; and
controlling, by the jumping unit, the first storage capacitor so that the potential of the first end of the first storage capacitor becomes the potential of the first signal from the potential of the data signal, and the potential of the second end of the first storage capacitor equals to a sum of the potential of the first signal and the potential of the voltage threshold of the driving transistor minus the potential of the data signal, within a third stage of the time period.

13. The method according to claim 12, wherein the step of display driving further comprises:
transmitting, by the control unit, the first signal to the charging unit within the first stage, and transmitting the first signal to the source electrode of the driving transistor within the fourth stage.

14. The method according to claim 12, wherein:
within the first stage, the first scanning signal and the second scanning signal are at high level, the data signal and the control signal are at low level, the control unit and the charging unit are in an ON state, and the discharging unit and the jumping unit are in an OFF state;
within the second stage, the first scanning signal is at high level, the second scanning signal, the data signal and the control signal are at low level, the charging unit and the discharging unit are in the ON state, and the control unit and the jumping unit are in the OFF state;
within the third stage, the control signal and the data signal are at high level, the first scanning signal and the second scanning signal are at low level, the discharging unit and the jumping unit are in the ON state, and the charging unit and the control unit are in the OFF state; and
within the fourth stage, the second scanning signal and the data signal are at high level, the first scanning signal and the control signal are at low level, the control unit is in the ON state, and the charging unit, the discharging unit and the jumping unit are in the OFF state.

15. The method according to claim 11, wherein the step of touch detection comprises:

charging, by a phototransistor, a second storage capacitor under the control of the first scanning signal, and generating a corresponding charging current signal based on light intensity, within both the first stage and the second stage of the time period; and transmitting, by a switch transistor, the charging current signal generated by the phototransistor to the signal reading line under the control of the control signal, so that a processor determines information of a location of the touch operation based on the charging current signal, within the third stage of the time period.

16. The method according to claim 15, wherein:

in both the first stage and the second stage, the first scanning signal is at high level, the control signal is at low level, the phototransistor is in an ON state, and the switch transistor is in an OFF state;

in the third stage, the first scanning signal is at low level, the control signal is at high level, the phototransistor is in the OFF state, and the switch transistor is in the ON state; and in the fourth stage, the first scanning signal and the control signal are at low level, and the phototransistor and the switch transistor are in the OFF state.

17. The pixel circuit according to claim 1, wherein the in-cell touch detection module comprises:

a second storage capacitor, a phototransistor and a switch transistor; wherein:

a first end of the second storage capacitor is connected to the first scanning line, a second end of the second storage capacitor is connected to a drain electrode of the phototransistor and a source electrode of the switch transistor respectively;

both a source electrode and a gate electrode of the phototransistor are connected to the first scanning line, the phototransistor is arranged to charge the second storage capacitor under the control of the first scanning signal, and generate a corresponding charging current signal based on light intensity, within both a first stage and a second stage of the time period; and a gate electrode of the switch transistor is connected to the control line, a drain electrode of the switch transistor is connected to the signal reading line, the switch transistor is arranged to transmit the charging current signal generated by the phototransistor to the signal reading line under the control of the control signal, so that a processor determines information of a location of the touch operation based on the charging current signal, within a third stage of the time period.

18. The pixel circuit according to claim 1, wherein the first signal is at high level, and a second signal inputted by the second signal source is at low level.

19. An organic light-emitting diode (OLED) display panel comprising the pixel circuit according to claim 1.

20. A display device comprising the organic light-emitting diode (OLED) display panel according to claim 19.

* * * * *